United States Patent
Yuan et al.

(10) Patent No.: US 10,886,344 B2
(45) Date of Patent: Jan. 5, 2021

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Guangcai Yuan, Beijing (CN); Dejiang Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 16/342,381

(22) PCT Filed: May 14, 2018

(86) PCT No.: PCT/CN2018/086705
§ 371 (c)(1),
(2) Date: Apr. 16, 2019

(87) PCT Pub. No.: WO2018/233400
PCT Pub. Date: Dec. 27, 2018

(65) Prior Publication Data
US 2019/0333973 A1    Oct. 31, 2019

(30) Foreign Application Priority Data
Jun. 21, 2017  (CN) .......................... 2017 1 0474127

(51) Int. Cl.
*H01L 27/32* (2006.01)
*H01L 51/00* (2006.01)
(Continued)

(52) U.S. Cl.
CPC ...... *H01L 27/3246* (2013.01); *H01L 51/0005* (2013.01); *H01L 51/56* (2013.01);
(Continued)

(58) Field of Classification Search
None
See application file for complete search history.

(56) References Cited

U.S. PATENT DOCUMENTS

| 2010/0213827 A1* | 8/2010 | Yoshida | H01L 27/3246 313/504 |
| 2014/0206119 A1* | 7/2014 | Kang | H01L 51/56 438/34 |

(Continued)

FOREIGN PATENT DOCUMENTS

| CN | 105826355 A | 8/2016 |
| CN | 106328679 A | 1/2017 |

(Continued)

OTHER PUBLICATIONS

International Search Report and Written Opinion for Application No. PCT/CN2018/086705, dated Aug. 1, 2018, 9 Pages.

*Primary Examiner* — Khaja Ahmad
(74) *Attorney, Agent, or Firm* — Brooks Kushman P.C.

(57) ABSTRACT

A display substrate, a manufacturing method thereof and a display device are provided. Pixel regions of the display substrate are divided into a plurality of pixel groups, and a plurality of guide bars is arranged at a surface of a pixel definition layer between at least parts of adjacent pixel regions in each pixel group. A guide groove is formed between two adjacent guide bars, so as to guide the flow of ink, thereby to enable the ink to be uniformly distributed at all the pixel regions in each pixel group.

18 Claims, 5 Drawing Sheets

(51) Int. Cl.
    *H01L 51/56* (2006.01)
    *H01L 51/50* (2006.01)
    *H01L 51/52* (2006.01)

(52) U.S. Cl.
    CPC ...... *H01L 51/5072* (2013.01); *H01L 51/5092* (2013.01); *H01L 51/5221* (2013.01)

(56) References Cited

U.S. PATENT DOCUMENTS

| | | | |
|---|---|---|---|
| 2014/0284588 A1* | 9/2014 | Takeuchi | H01L 51/56 257/40 |
| 2016/0284774 A1* | 9/2016 | Zhang | H01L 27/1218 |
| 2017/0005151 A1 | 1/2017 | Kim et al. | |
| 2017/0213881 A1* | 7/2017 | Kondo | H01L 27/3211 |
| 2018/0204891 A1 | 7/2018 | Zhao | |

FOREIGN PATENT DOCUMENTS

| | | |
|---|---|---|
| CN | 107331681 A | 11/2017 |
| JP | 2007094256 A | 4/2007 |

\* cited by examiner

DISPLAY SUBSTRATE, MANUFACTURING METHOD THEREOF, AND DISPLAY DEVICE

CROSS-REFERENCE TO RELATED APPLICATION APPLICATIONS

This application is the U.S. national phase of PCT Application No. PCT/CN2018/086705 filed on May 14, 2018, which claims priority to Chinese Patent Application No. 201710474127.0 filed on Jun. 21, 2017, which are incorporated herein by reference in their entireties.

TECHNICAL FIELD

The present disclosure relates to the field of display technology, in particular to a display substrate, a manufacturing method thereof, and a display device.

BACKGROUND

Organic Light-Emitting Diode (OLED) technology has been considered as a next-generation display technology due to such advantages as self-luminescence, rapid response, wide viewing angle, high brightness, being color-rich, and being thin and light, as compared with a Liquid Crystal Display (LCD) technology.

Usually, common layer structures, i.e., structures at different pixel regions which have a same function and to which a same signal is applied during the display, is adopted for an OLED display device, and these common layer structures are formed simultaneously by applying a same material through an ink-jet printing process. The ink-jet printing process is especially adapted to a large-size display device due to high material utilization. However, for a medium-size or small-size display device, it is difficult for the ink-jet printing process to provide these structures with a uniform thickness, so it is impossible to achieve a good printing effect at a high resolution. In order to improve the printing resolution, it is necessary to significantly improve a device, and at this time, the device may not operate stably.

SUMMARY

In one aspect, the present disclosure provides in some embodiments a display substrate, including a base substrate, and a pixel definition layer arranged on the base substrate and configured to define a plurality of pixel regions, wherein the plurality of pixel regions is divided into a plurality of pixel groups, and each pixel group comprises adjacent pixel regions; for each pixel group, the pixel definition layer comprises a first pixel definition layer arranged between two adjacent pixel regions, and a plurality of guide bars is arranged at a surface of the first pixel definition layer arranged between at least parts of the adjacent pixel regions; and each guide bar extends from a side of one of the two adjacent pixel regions to a side of the other one of the two adjacent pixel regions, and a guide groove is formed between two adjacent guide bars.

In some embodiments, a partitioning bar is arranged in the guide groove to divide the guide groove into two sections in an extension direction of the guide groove, and a surface of the partitioning bar away from the base substrate is located at a level lower than a surface of the adjacent guide bar away from the base substrate.

In some embodiments, the partitioning bar is spaced apart from the corresponding two adjacent pixel regions at a same distance.

In some embodiments, the plurality of guide bars between two adjacent pixel regions is arranged parallel to each other, and spaced apart from each other at a same distance.

In some embodiments, each partitioning bar is arranged perpendicular to the corresponding guide bar.

In some embodiments, the plurality of pixel regions in each pixel group is arranged in a matrix form, and the plurality of guide bars is arranged at the surface of the first pixel definition layer between every two adjacent pixel regions in a first direction.

In some embodiments, each pixel group comprises a plurality of pixel regions in a same row.

In some embodiments, the pixel definition layer further comprises a second pixel definition layer arranged between two adjacent rows of pixel regions and arranged at a same layer as the first pixel definition layer.

In another aspect, a display device includes the above display substrate.

In yet another aspect, a method for manufacturing the above display substrate, including applying, through nozzles, a same ink material to all the pixel groups each at least corresponding to one nozzle, to enable the ink material to be uniformly distributed at all the pixel regions in each pixel group under the effect of each guide groove.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure provides in some embodiments a display substrate, which includes a pixel definition layer configured to define a plurality of pixel regions, and a common layer structure arranged at a plurality of adjacent pixel regions. The common layer structure is formed through an ink-jet printing process, so as to improve the material utilization, reduce the manufacture cost, increase a film formation speed and improve the production tact.

In the embodiments of the present disclosure, the plurality of pixel regions is divided into a plurality of pixel groups, and each pixel group includes adjacent pixel regions. For each pixel group, the pixel definition layer includes a first pixel definition layer arranged between every two adjacent pixel regions, and a plurality of guide bars is arranged at a surface of the first pixel definition layer arranged between at least parts of adjacent pixel regions. Each guide bar extends from a side of one of the two adjacent pixel regions to a side of the other one of the two adjacent pixel regions, and a guide groove is formed between every two adjacent guide bars. When a same ink material is applied through nozzles to each pixel group, the ink material may be uniformly distributed at all the pixel regions in the pixel group under the effect of the guide groove. As a result, it is able to provide the common layer structure corresponding to the pixel group with a uniform thickness, thereby to improve the printing quality as well as a display effect.

According to the embodiments of the present disclosure, through the improvement in the structure of the pixel definition layer, it is able for the ink-jet printing process to be applied to the manufacture of a large-size, medium-size or small-size display device. In addition, it is able to achieve the ink-jet printing process at a high resolution, ensure the printing quality for the common layer structure, and overcome the limitation of the size of the display device to the high-resolution ink-jet printing process.

In the embodiments of the present disclosure, the ink-jet printing resolution may be the same as a resolution of the display device.

The scheme in the embodiments of the present disclosure may be applied to any display devices having a common layer structure at a plurality of adjacent pixel regions, e.g., an OLED display device.

The present disclosure will be described hereinafter in conjunction with the drawings and embodiments. The following embodiments are for illustrative purposes only, but shall not be used to limit the scope of the present disclosure.

The following description will be given by taking an OLED display substrate as an example. When the scheme in the embodiments of the present disclosure is applied to the manufacture of the other display substrate, the structure of the pixel definition layer and the manufacture procedure of the common layer structure will the same as those for the OLED display substrate.

Figure 1:
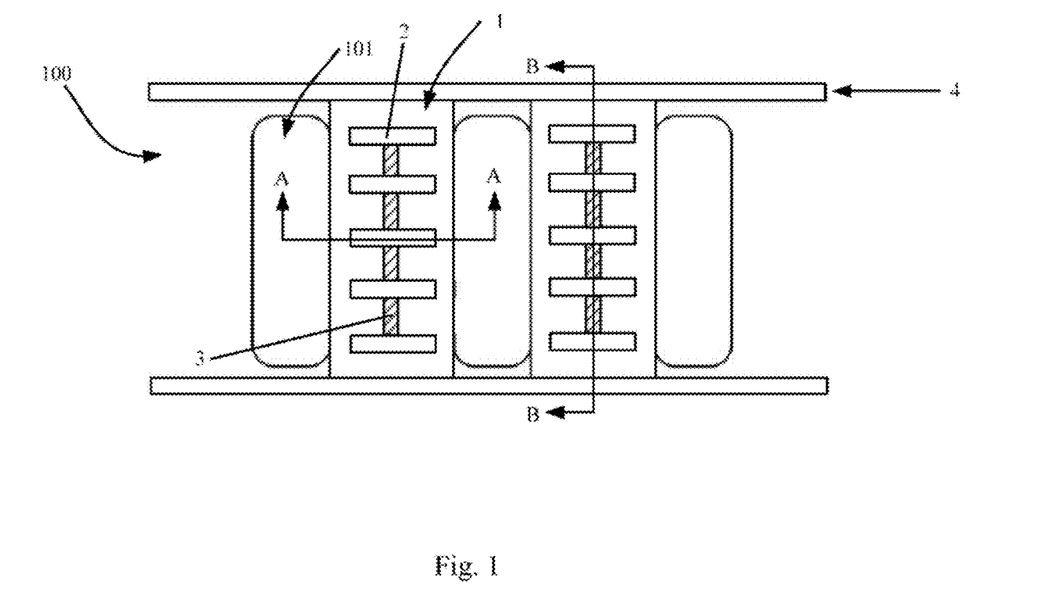
FIG. 1 is a schematic view showing a display substrate according to some embodiments of the present disclosure.
Figure 2:
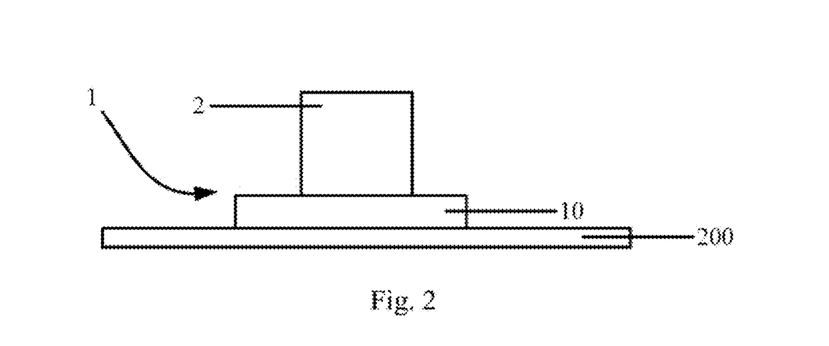
FIG. 2 is a partial sectional view of the display substrate in FIG. 1 along line A-A.
Figure 3:
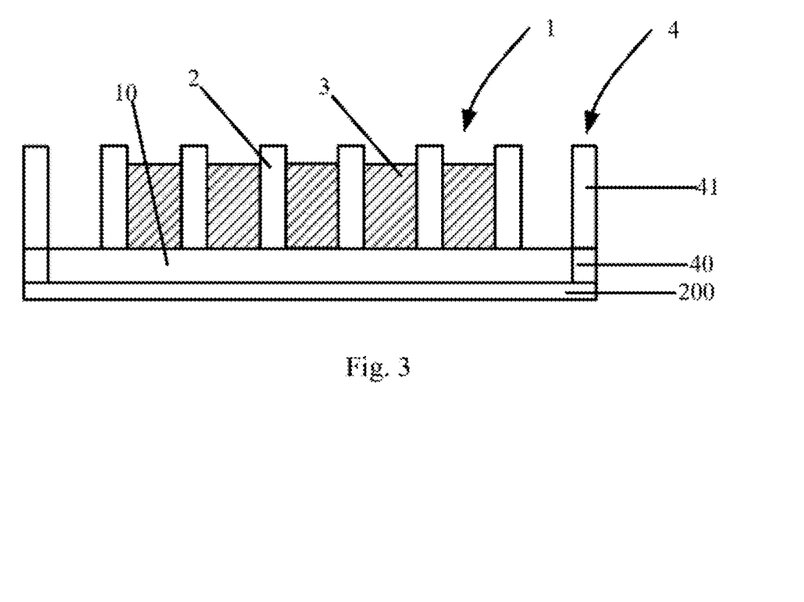
FIG. 3 is a partial sectional view of the display substrate in FIG. 1 along line B-B.

FIG. 1 is a schematic view showing the display substrate according to some embodiments of the present disclosure, FIG. 2 is a partial sectional view of the display substrate in FIG. 1 along line A-A, and FIG. 3 is a partial sectional view of the display substrate in FIG. 1 along line B-B.

As shown in FIGS. 1-3, the OLED display substrate includes a substrate 200, and a pixel definition layer arranged on the substrate 200 and configured to define a plurality of pixel regions 101. Each pixel region 101 includes an OLED for emitting a light beam in a specific color, so as to achieve full-color display. The OLED includes a cathode, an anode, a light-emitting layer arranged between the cathode and the anode, and such functional layers as electron injection layer, electron transport layer, hole injection layer and hole transport layer. The cathodes at all the pixel regions 101 may form a common layer structure, the electron transport layers at all the pixel regions 101 may form a common layer structure, and the hole transport layers at all the pixel regions 101 may form a common layer structure, i.e., members which have a same function and to which a same signal is applied during the display may be considered as a common layer structure.

The plurality of pixel regions 101 may be divided into a plurality of pixel groups 100, and each pixel group 100 may include a plurality of adjacent pixel regions 101. For each pixel group 100, the pixel definition layer may include a first pixel definition layer 1 arranged between every two adjacent pixel regions 101, and a plurality of guide bars 2 may be arranged at a surface of the first pixel definition layer 1 arranged between at least parts of adjacent pixel regions 101. Each guide bar 2 may extend from a side of one of the two pixel regions 101 to a side of the other one of the two pixel regions 101, and a guide groove may be formed between every two adjacent guide bars 2.

According to the display substrate in the embodiments of the present disclosure, the pixel regions 101 are divided into the plurality of pixel groups 100, and the plurality of guide bars 2 is arranged at the surface of the pixel definition layer between at least parts of adjacent pixel regions 101 in each pixel group 100. Each guide groove is formed between two adjacent guide bars 2, so as to guide the flow of the ink, thereby to enable the ink to be distributed uniformly at all the pixel regions 101 in the pixel group 100. As a result, it is able to provide the common layer structure of the OLED display substrate with a uniform thickness, thereby to improve the printing quality as well as the display effect.

According to the embodiments of the present disclosure, through the improvement in the structure of the pixel definition layer, it is able for the ink-jet printing process to be applied to the manufacture of a large-size, medium-size or small-size display device. In addition, it is able to achieve the ink-jet printing process at a high resolution, ensure the printing quality for the common layer structure, and overcome the limitation of the size of the display device for the high-resolution ink-jet printing process. In addition, it is able to effectively increase the thickness of the common layer structure while ensuring the uniform thickness thereof.

Top-Emitting OLED (TEOLED) has attracted more and more attention in an organic flat-panel display field, especially in a microdisplay field due to such advantages as high resolution, large aperture ratio and substrate optionality. However, a light intensity and a color purity of the display device are seriously limited due to an optical microcavity effect of the TEOLED, especially for blue and white TEOLEDs. Hence, it is difficult to manufacture the blue and white TEOLEDs, and thereby the performance of the display device may be adversely affected. For the white TEOLED, a blue light beam is suppressed due to the optical microcavity effect of the white TEOLED, so an intensity of the blue light beam in a white light beam is insufficient, and the white light beam may become reddish. For the blue TEOLED, the blue light beam is suppressed due to the optical microcavity effect of the blue TEOLED, so the light intensity of the blue TEOLED may be relatively weak. In order to solve the above problems, one method includes enhancing an output intensity of the blue light beam through multi-beam interference in the optical microcavity effect, so as to improve the color purity of the white light beam and the intensity of the blue light beam. Principles and experiments show that, when the hole transport layer and/or the hole injection layer has a thickness of 100 nm, a resonance wavelength in a microcavity may match that of the blue light beam, so it is able to enhance the output intensity of the blue light beam and obtain balanced white light beams. Hence, it is necessary to increase the thickness of the hole transport layer and/or the hole injection layer. In the related art, due to the limitation of the printing resolution, it is very difficult to increase the thickness of the hole transport layer and/or the hole injection layer for the medium-size or small-size display device. However, through the scheme in the embodiments of the present disclosure, it is able to increase the thicknesses of the hole injection layer and the hole transport layer of the TEOLED efficiently, thereby to prevent the light intensity and the color purity of the TEOLED from being adversely affected due to the optical microcavity effect.

Figure 9A:
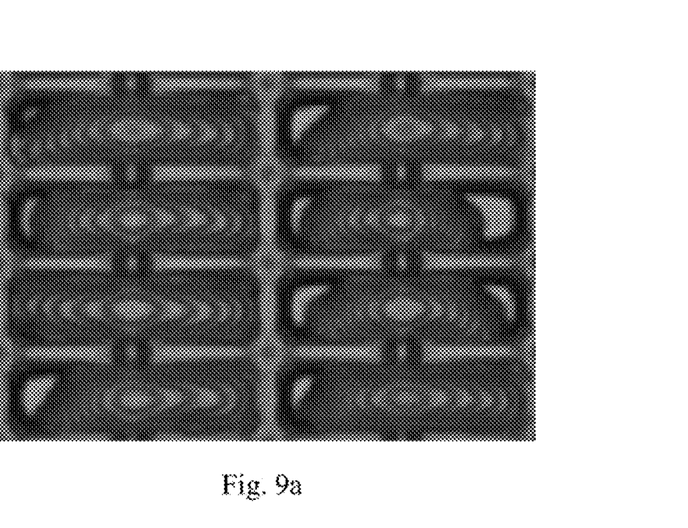
FIG. 9a is a schematic view showing the distribution of ink on the entire display substrate during the formation of the common layer structure in the related art.
Figure 9B:
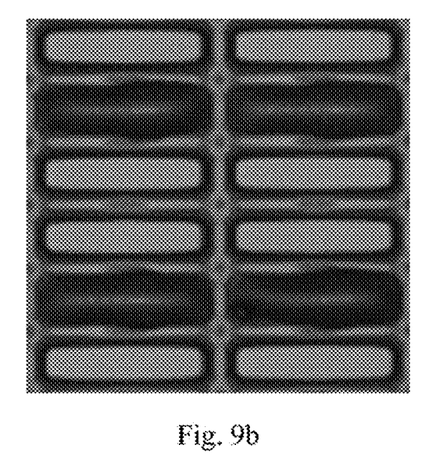
FIG. 9b is a schematic view showing the distribution of ink on the entire display substrate during the formation of the common layer structure according to some embodiments of the present disclosure.

FIG. 9a shows the distribution of the ink on the entire display substrate during the formation of the common layer structure in the related art (where no guide bar is formed at the surface of the pixel definition layer), and FIG. 9b shows the distribution of the ink on the entire display substrate during the formation of the common layer structure in the embodiments of the present disclosure. By comparing FIG. 9a with FIG. 9b, it is easily found that, when the scheme in the embodiments of the present disclosure is adopted, the ink may be uniformly distributed on the entire display substrate and the common layer structure acquired after the ink is dried may have a uniform thickness, and when no guide bar is formed at the surface of the pixel definition layer, bulges may easily occur and the ink may not be distributed uniformly.

Each guide groove may have a depth of about 2000 nm, and each functional layer of the OLED may have a thickness of about 60 nm, so it is able for the guide groove to guide the flow of the ink during the formation of the common layer structures through the ink-jet printing process, thereby to provide each common layer structure with a uniform thickness. For a non-common layer structure, e.g., the light-emitting layer for emitting a light beam in a specific color, it may be formed at the corresponding pixel region 101 through evaporation.

It should be appreciated that, in order to enable the guide groove to guide the flow of the ink, it is necessary to ensure that a surface of the ink for forming the common layer structure away from the substrate is at a level higher than a bottom of the guide groove. In order to prevent the formation of a next common layer structure from being adversely affected, it is also necessary to ensure that the surface of the ink for forming the common layer structure is at a level lower than a surface of the guide bar away from the substrate. The depth of the guide groove refers to an extension length of the guide groove in a direction perpendicular to a plane where the substrate is located. The level of the surface of the ink, the level of the bottom of the guide groove and the level of the surface of the guide bar each refers to a level relative to a surface of the substrate in the direction perpendicular to the plane where the substrate is located.

In a possible embodiment of the present disclosure, all the guide bars 2 arranged between two adjacent pixel regions 101 may be arranged parallel to each other. To be specific, an extension direction of each guide bar 2 may be approximately parallel to an arrangement direction of the corresponding two adjacent pixel regions 101, e.g., at an angle smaller than 100, so as to ensure a flow guiding effect.

In a possible embodiment of the present disclosure, all the guide bars 2 arranged between two adjacent pixel regions 101 may be spaced apart from each other at a same distance, so as to guide the ink uniformly.

In order to improve the flow guiding effect, a partitioning bar 3 may also be arranged in each guide groove, so as to divide the guide groove into two sections in an extension direction of the guide groove. A surface of each partitioning bar 3 away from the substrate 200 may be at a level lower than a surface of the adjacent guide bar 2 away from the substrate 200. Through the partitioning bar 3, it is able to guide the ink to two sides of the guide groove uniformly, thereby to improve the thickness uniformity of the common layer structure.

Each partitioning bar 3 may be spaced apart from the corresponding two adjacent pixel regions at a same distance, so as to equally divide the guide groove into two sections, thereby to guide the ink to the corresponding two pixel regions 101 uniformly. For the same purpose, when all the guide bars 2 between the two adjacent pixel regions 101 are arranged parallel to each other, each partitioning bar 3 may be arranged perpendicular to the corresponding guide bar 2.

It should be appreciated that, in order to enable the partitioning bar to guide the ink, it is necessary to ensure that the surface of the ink for forming the common layer structure away from the substrate is at a level higher than a surface of the partitioning bar away from the substrate. In order to prevent the formation of a next common layer structure from being adversely affected, it is also necessary to ensure that the surface of the common structure layer away from the substrate acquired after the ink is dried is at a level lower than the surface of the guide bar away from the substrate. The level of the surface of the common layer structure and the level of the surface of the partitioning bar each refer to a level relative to the surface of the substrate in the direction perpendicular to the plane where the substrate is located.

Usually, the pixel regions 101 of the display substrate are distributed in a matrix form, i.e., the pixel regions are arranged in rows and columns. The pixel regions 101 in a same row are arranged in a first direction, the pixel regions 101 in a same column are arranged in a second direction angled relative to the first direction at an angle greater than 0. Hence, the pixel regions 101 in each pixel group 100 may also be arranged in a matrix form, so as to facilitate the division and simplify the structure. It should be appreciated that, the concepts of "row" and "column" are introduced herein merely for ease of understanding, not for limiting.

In a possible embodiment of the present disclosure, for each pixel group 100, the plurality of guide bars 2 may be arranged at the surface of the first pixel definition layer 1 between every two adjacent pixel regions 101 in the first direction, and the guide groove may be formed between every two adjacent guide bars 2. In other words, for each pixel group 100, the guide bars 2 may merely be arranged at the surface of the pixel definition layer 1 between the adjacent pixel regions 101 in a same row. During the ink-jet printing process, for each pixel group 100, the pixel regions in a same row may correspond to at least one nozzle, so as to form the common layer structure by ink-jet printing. In addition, due to the guide groove, it is able to uniformly distribute the ink at all the pixel regions 101 in the same row, thereby to provide the common layer structure at the pixel regions in the same row with a uniform thickness. For each pixel group 100, different rows of pixel regions may correspond to different nozzles so as to form the common layer structure by ink-jet printing. Because the common layer structure at the pixel regions in the same row has a uniform thickness, it is able to provide the common layer structure at all rows of the pixel regions with a uniform thickness through controlling an amount of the ink at all rows of the pixel regions, and provide the common layer structure at the entire display substrate with a uniform thickness. As a result, it is able to improve the printing quality as well as the display effect.

When the guide bars 2 between two adjacent pixel regions 101 are arranged parallel to each other, the guide bars 2 may extend approximately in the first direction, e.g., at angle of smaller than 10° relative to the first direction, so as to improve the flow guiding effect.

Further, the guide bars 2 between two adjacent pixel regions 101 may also be spaced apart from each other at a same distance.

The partitioning bar 3 may be arranged in each guide groove, so as to divide the guide groove into two sections in the first direction. A surface of the partitioning bar 3 away from the substrate 200 may be located at a level lower than the surface of the guide bar 2 away from the substrate 200. Through the partitioning bar 3, it is able to uniformly guide the ink to the two sides of the guide groove, thereby to provide the common layer structure with a uniform thickness.

The partitioning bar 3 may be spaced apart from the corresponding two adjacent pixel regions 101 at a same distance, so as to equally divide the guide groove into two same sections, thereby to uniformly guide the ink to the corresponding two pixel regions 101. For the same purpose, when all the guide bars 2 between the two adjacent pixel regions 101 are arranged parallel to each other, the partitioning bar 3 may be arranged perpendicular to the corresponding guide bar 2.

It should be appreciated that, the above structure is merely a feasible one in the embodiments of the present disclosure. For example, the guide bars may also be arranged at the surface of the first pixel definition layer between every two adjacent pixel regions in the second direction; or arranged at the surface of the first pixel definition layer between at least parts of adjacent pixel regions in the first direction; or arranged at the surface of the first pixel definition layer between at least parts of adjacent pixel regions in the second direction; or arranged at the surface of the first pixel definition layer between at least parts of adjacent pixel regions in the first direction and the surface of the first pixel definition layer between at least parts of adjacent pixel regions in the second direction.

Figure 4:
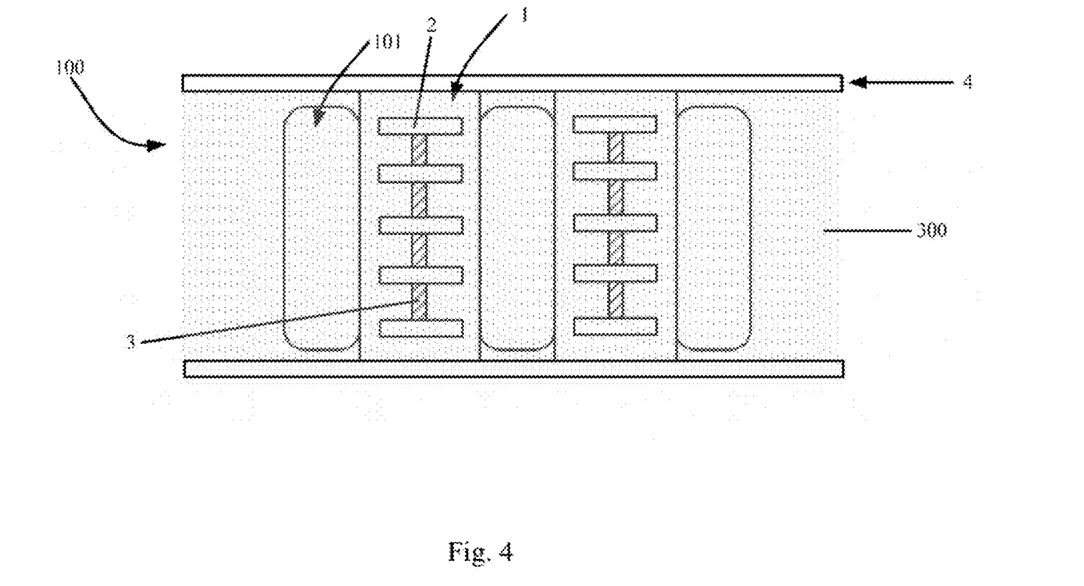
FIG. 4 is a schematic view showing the manufacture of a common layer structure of the display substrate according to some embodiments of the present disclosure.

In a possible embodiment of the present disclosure, each pixel group 100 may include the pixel regions 101 in a same row, i.e., one pixel group 100 may include the pixel regions 101 in the first direction. During the ink-jet printing process, the pixel regions 101 in each row may correspond to at least one nozzle which is configured to apply a same ink material to all the pixel regions 101 in the row. Due to the guide groove, the ink 300 may be distributed uniformly at the pixel regions 101, so as to provide the common layer structure at the pixel regions 101 in the same row with a uniform thickness, as shown in FIG. 4. The pixel regions in different rows may correspond to different nozzles. Because the common layer structure at the pixel regions in the same row has a uniform thickness, it is able to provide the common layer structure at all rows of the pixel regions with a uniform thickness through controlling an amount of the ink at all rows of the pixel regions being the same, and further provide the common layer structure at the entire display substrate with a uniform thickness. As a result, it is able to improve the printing quality as well as the display effect.

Figure 10:
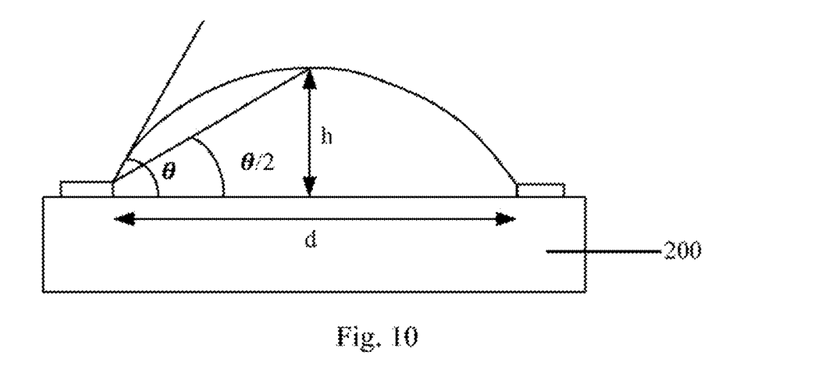
FIG. 10 is a schematic view showing a situation where a maximum amount of ink is applied to each pixel region according to some embodiments of the present disclosure.

As shown in FIG. 10, a maximum ink amount at each pixel region may be calculated through the following equation: $h=d \sin \theta/2$, where $\theta$ represents a tangential angle between a surface of the ink and the plane where the substrate 200 is located when the ink is applied to the pixel region in a maximum amount, h represents a distance between an apex of the surface of the ink and the plane where the substrate 200 is located, and d represents a length of a short side of each pixel region. Through setting the maximum ink amount, it is able to prevent the ink from overflowing the corresponding pixel region. Taking a 55-inch display device having a PPI value of 800 and a resolution of 4k as an example, $\theta=60°$, so h may be equal to 11 μm, and at this time, the ink may not overflow the corresponding pixel region.

The maximum ink amount at the pixel regions in each row (i.e., for each pixel group 100) may be approximately a sum of the maximum ink amounts at all the pixel regions in the same row.

In addition, the guide bars 2 may be arranged at the surface of the first pixel definition layer 1 between the adjacent pixel regions 101 in the same row, so as to distribute the ink uniformly at all the pixel regions 101 in the same row.

All the guide bars 2 may extend in the first direction, and may be arranged parallel to each other. The guide bars 2 arranged between two adjacent pixel regions 101 may be spaced apart from each other at a same distance.

The partitioning bar 3 may be arranged in each guide groove and perpendicular to the guide bar 2, so as to uniformly guide the ink to the corresponding two pixel regions 101. For the same purpose, the partitioning bar 3 may be spaced apart from the corresponding two adjacent pixel regions 101 at a same distance.

In order to define the plurality of pixel regions 101, the pixel definition layer may further include a second pixel definition layer 4 arranged between every two adjacent rows of pixel regions 101. A surface of the second pixel definition layer 4 away from the substrate 200 may be located at a level not lower than the surface of the guide bar 2 away from the substrate 200, so as to prevent the ink corresponding to the two adjacent rows of pixel regions from interfering each other. In a possible embodiment of the present disclosure, the surface of the second pixel definition layer 4 away from the substrate 200 may be located at a same level as the surface of the guide bar 2 away from the substrate 200.

The second pixel definition layer 4 may be arranged at a same layer as the first pixel definition layer 1, so as to simplify a manufacture process. As shown in FIGS. 5-8, the first pixel definition layer 1 and the second pixel definition layer 4 may be formed as follows.

Figure 5:
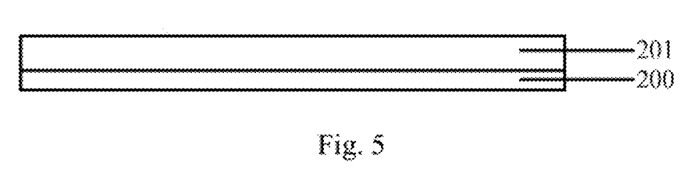
FIGS. 5-8 are schematic views showing the manufacture of a first pixel definition layer 1 according to some embodiments of the present disclosure.
Figure 6:
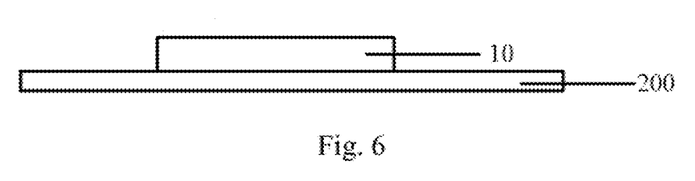

At first, as shown in FIG. 5, a first photosensitive layer 201 may be formed on the substrate 200, and then exposed and developed, so as to form a first sub-layer 10 of the first pixel definition layer 1 and a second sub-layer 40 of the second pixel definition layer 4. As shown in FIGS. 3 and 6, the first sub-layer 10 and the second sub-layer 40 in FIG. 3 are marked merely for ease of understanding, and actually they are an integral piece.

Figure 7:
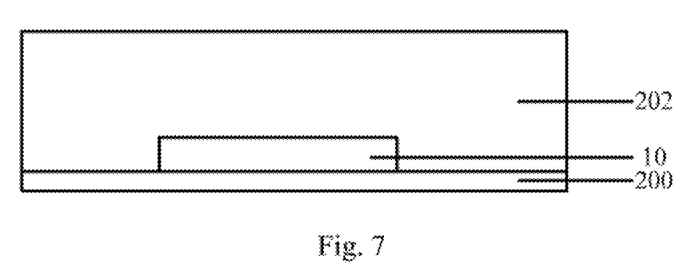
Figure 8:
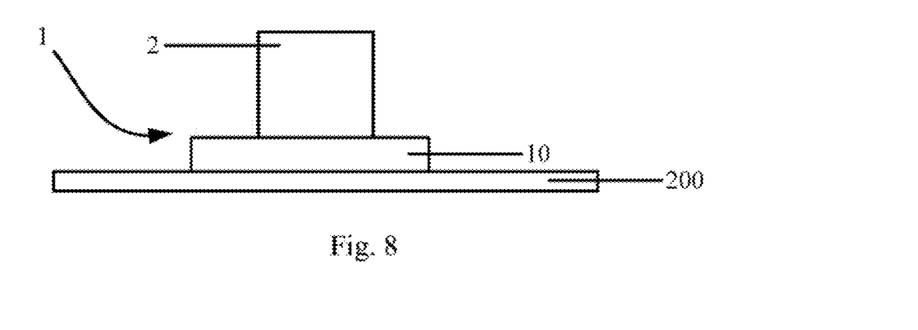

Next, as shown in FIG. 7, a second photosensitive layer 20 may be formed so as to cover the first sub-layer 10 and the second sub-layer 40, and then exposed and developed, so as to form the guide bars 2 on the first sub-layer 10 and form a third sub-layer 41 of the second pixel definition layer 4 on the second sub-layer 40, as shown in FIGS. 3 and 8.

Through the above steps, the acquired first pixel definition layer 1 may include the first sub-layer 10 and the guide bars 2 on the first sub-layer 10, and the second pixel definition layer 4 includes the second sub-layer 40 and the third sub-layer 41 arranged one on another. At this time, the first pixel definition layer 1 may be arranged at a same layer as the second pixel definition layer 4, and a surface of the second pixel definition layer 4 away from the substrate 200 may be located at a same level as the surface of the guide bar 2 away from the substrate 200.

When each pixel region 101 has a size of 210*70 μm, a pixel structure will be described as follows.

In a column direction, the second pixel definition layer 4 may have a width of 10 µm, and a distance between two adjacent second pixel definition layers 4 may be 316.5 µm. In a row direction, a distance between two adjacent first pixel definition layers 1 may be 105.5 µm. In the row direction, the first pixel definition layer 1 may have a width of 35 µm, each guide bar 2 may have a length of 20 µm, and a distance between each guide bar 2 and each of the two adjacent pixel regions 101 may be 7.5 µm. In the column direction, each guide bar 2 may have a width of 10 µm. For the plurality of guide bars between two adjacent pixel regions 101, in the column direction, a distance between every two adjacent guide bars 2 may be 50 µm.

According to the embodiments of the present disclosure, each pixel group may include the pixel regions in a same row, and through the guide bars, it is able to form the common layer structure having a uniform thickness at all the pixel regions in the same row through the ink-jet printing process. Through controlling the amount of the ink applied to the pixel regions in all the rows, it is able to provide the common layer structure of the entire display substrate with a uniform thickness, thereby to achieve a high-resolution ink-jet printing operation. In addition, it is able to form the pixel definition layers of the entire display substrate at a same layer, thereby to simplify the manufacture process and reduce the manufacture cost.

According to the embodiments of the present disclosure, each pixel group may also include the pixel regions in adjacent rows. The guide bars may be merely arranged at the surface of first pixel definition layer between every two adjacent pixel regions in the same row. During the ink-jet printing process, the pixel regions in each row may correspond to at least one nozzle which is configured to apply a same material to all the pixel regions in the same row, so it is able to provide the common layer structure at all the pixel regions in the same row with a uniform thickness. Identically, the second pixel definition layer between every two rows of pixel regions may also be arranged at a same layer as the first pixel definition layer, so as to simplify the manufacture process, and prevent the ink at the pixel regions in different rows from interfering each other during the ink-jet printing process.

The present disclosure further provides in some embodiments a display device including the above-mentioned display substrate. As mentioned above, it is able to form the common layer structure of the display substrate through the ink-jet printing process and provide the common layer structure with a uniform thickness, thereby to achieve the high-resolution ink-jet printing operation, and reduce the manufacture cost while ensuring the display effect.

The present disclosure further provides in some embodiments a method for manufacturing the above-mentioned display substrate, which includes applying, through nozzles, a same ink material to all the pixel groups each at least corresponding to one nozzle, so as to enable the ink material to be uniformly distributed at all the pixel regions in each pixel group under the effect of each guide groove.

According to the method in the embodiments of the present disclosure, the ink is uniformly applied through the ink-jet printing process so as to form the common layer structure at all the pixel regions in each pixel group, thereby to provide the common layer structure with a uniform thickness. Through controlling the amount of the ink applied to each of all the pixel groups, it is able to provide the common layer structure of the entire display substrate with a uniform thickness, thereby to achieve the high-resolution ink-jet printing operation, and reduce the manufacture cost while ensuring the display effect.

Each pixel group may include all the pixel regions in a same row. The pixel regions of the display substrate may be defined by the pixel definition layer, and the pixel definition layer may include the first pixel definition layer arranged between every two adjacent pixel regions in each pixel group and the second pixel definition layer arranged between every two adjacent rows of pixel regions. The pixel definition layer may be formed as follows.

At first, a first photosensitive layer may be formed on the substrate, and then exposed and developed, so as to form a first sub-layer of the first definition layer and a second sub-layer of the second definition layer.

Next, a second photosensitive layer may be formed to cover the first sub-layer and the second sub-layer, and then exposed and developed, so as to form the guide bars on the first sub-layer and form a third sub-layer of the second pixel definition layer on the second sub-layer.

Through the above steps, the acquired first pixel definition layer may include the first sub-layer and the guide bars arranged on the first sub-layer, and the second pixel definition layer may include the second sub-layer and the third sub-layer arranged one on another. The first pixel definition layer may be arranged at a same layer as the second pixel definition layer, so as to simplify the manufacture process.

Usually, two layer structures of the pixel definition layer may each be made of a resin material. Due to the same lyophobic characteristic, a first resin layer and a second resin layer may repel each other, so it is impossible to apply the resin material normally. A hexamethyl disilazane (HMDS) process may be performed between the formation of the two resin layers, so as to increase an adhesion level between the two resin layers and prevent them from falling off from each other. To be specific, —OH radicals in the first resin layer may be removed through HMDS, so as to provide the first resin layer with a hydrophobic surface and increase an adhesion capability of the first resin layer, thereby to increase the adhesion level between the first resin layer and the second resin layer thereon, i.e., to increase the adhesion between the first sub-layer and the guide bars of the first pixel definition layer, and increase the adhesion between the second sub-layer and the third sub-layer of the second pixel definition layer.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, and a pixel definition layer arranged on the base substrate and configured to define a plurality of pixel regions, wherein
    each pixel region comprises an OLED for emitting a light beam in a specific color, the OLED includes a cathode, an anode, a light-emitting layer arranged between the cathode and the anode,
    the plurality of pixel regions is divided into a plurality of pixel groups, and each pixel group comprises adjacent pixel regions;
    for each pixel group, the pixel definition layer comprises a first pixel definition layer arranged between two adjacent pixel regions, and a plurality of guide bars is arranged at a surface of the first pixel definition layer arranged between at least parts of the adjacent pixel regions; and each guide bar extends from a side of one of the two adjacent pixel regions to a side of the other one of the two adjacent pixel regions, and a guide groove is formed between two adjacent guide bars, wherein a partitioning bar is arranged in the guide groove to divide the guide groove into two sections in an extension direction of the guide groove, and a surface of the partitioning bar away from the base substrate is located at a level lower than a surface of the adjacent guide bar away from the base substrate.

2. The display substrate according to claim 1, wherein the partitioning bar is spaced apart from the two adjacent pixel regions at a substantially same distance.

3. The display substrate according to claim 1, wherein the plurality of guide bars between two adjacent pixel regions is substantially arranged parallel to each other, and spaced apart from each other at a substantially same distance.

4. The display substrate according to claim 3, wherein each partitioning bar is substantially arranged perpendicular to the guide bar.

5. The display substrate according to claim 1, wherein the plurality of pixel regions in each pixel group is arranged in a matrix form, and the plurality of guide bars is arranged at the surface of the first pixel definition layer between every two adjacent pixel regions in a first direction.

6. The display substrate according to claim 5, wherein each pixel group comprises a plurality of pixel regions in a same row.

7. The display substrate according to claim 6, wherein the pixel definition layer further comprises a second pixel definition layer arranged between two adjacent rows of pixel regions and arranged at a same layer as the first pixel definition layer.

8. A display device, comprising the display substrate according to claim 1.

9. A method for manufacturing the display substrate according to claim 1, comprising:

applying, through nozzles, a same ink material to all pixel groups of the plurality of pixel groups to form a common layer structure at all of the pixel regions of each pixel group, each pixel group at least corresponding to one nozzle of the nozzles; and forming a non-common layer structure at corresponding pixel regions through evaporation.

10. The display substrate according to claim 7, wherein a surface of the second pixel definition layer away from the substrate is located at a level not lower than the surface of the guide bar away from the substrate.

11. The display substrate according to claim 10, wherein the surface of the second pixel definition layer away from the substrate may be located at a same level as the surface of the guide bar away from the substrate.

12. The display substrate according to claim 1, wherein the OLED further comprises an electron injection layer, an electron transport layer, a hole injection layer and a hole transport layer.

13. The method according to claim 9, wherein the pixel definition layer defines the plurality of pixel regions on the base substrate, each pixel region further comprising an electron injection layer, an electron transport layer, a hole injection layer and a hole transport layer.

14. The method according to claim 13, wherein the cathode of the OLED is a common layer structure, the electron injection layer is a common layer structure, and the electron transport layer is the common layer structure.

15. The method according to claim 13, wherein the light-emitting layer is the non-common layer structure.

16. The method according to claim 13, wherein the pixel definition layer comprises the first pixel definition layer arranged between every two adjacent pixel regions in each pixel group and a second pixel definition layer arranged between every two adjacent rows of pixel regions, the step of forming the pixel definition layer comprises:

forming a first photosensitive layer on the base substrate, and exposing and developing the first photosensitive layer to form a first sub-layer of the first definition layer and a second sub-layer of the second definition layer;

forming a second photosensitive layer covering the first sub-layer and the second sub-layer; and exposing and developing the second photosensitive layer to form guide bars on the first sub-layer and form a third sub-layer of the second pixel definition layer on the second sub-layer.

17. The method according to claim 16, wherein the surface of the second pixel definition layer away from the base substrate may be located at a same level as the surface of the guide bar away from the base substrate.

18. The method according to claim 16, wherein each of the first pixel definition layer and the second pixel definition layer is a two layer structure, and made of a resin material, —OH radicals in a first resin layer is removed through hexamethyl disilazane, to provide the first resin layer with a hydrophobic surface.

* * * * *